United States Patent
Melton et al.

(10) Patent No.: US 9,692,419 B2
(45) Date of Patent: Jun. 27, 2017

(54) COMPACT LOGIC EVALUATION GATES USING NULL CONVENTION

(71) Applicant: Wave Semiconductor, Inc., Campbell, CA (US)

(72) Inventors: Benjamin Wiley Melton, Charlottesville, VA (US); Stephen Curtis Johnson, Morgan Hill, CA (US)

(73) Assignee: Wave Computing, Inc., Campbell, CA (US)

( * ) Notice: Subject to any disclaimer, the term of this patent is extended or adjusted under 35 U.S.C. 154(b) by 0 days.

(21) Appl. No.: 14/941,554

(22) Filed: Nov. 14, 2015

(65) Prior Publication Data

US 2016/0142057 A1    May 19, 2016

Related U.S. Application Data

(60) Provisional application No. 62/080,287, filed on Nov. 15, 2014.

(51) Int. Cl.
    *H03K 19/00*    (2006.01)
    *H03K 19/094*   (2006.01)

(52) U.S. Cl.
    CPC ............... *H03K 19/09429* (2013.01)

(58) Field of Classification Search
    CPC ........... H03K 17/165; H03K 19/00338; H03K 19/0185; H03K 19/09429; H03K 19/1738; H03K 19/20; H03K 3/012; H03K 3/0375; H03K 3/356121; H03K 3/356156; H03K 3/356173
    USPC ................... 326/93–98; 327/141 N; 714/700
    See application file for complete search history.

(56) References Cited

U.S. PATENT DOCUMENTS

| | | |
|---|---|---|
| 5,305,463 A | 4/1994 | Fant et al. |
| 5,355,496 A | 10/1994 | Fant et al. |
| 5,572,732 A | 11/1996 | Fant et al. |
| 5,640,105 A | 6/1997 | Sobelman et al. |
| 5,652,902 A | 7/1997 | Fant |
| 5,656,948 A | 8/1997 | Sobelman et al. |
| 5,664,211 A | 9/1997 | Sobelman et al. |

(Continued)

OTHER PUBLICATIONS

Rabaey (Jan M. Rabaey, "Digital Integrated Circuits—A Design Perspective", 2nd edition, 2003, Prentice Hall Electronics and VLSI series, pp. 522-523).*

(Continued)

Primary Examiner — Alexander H Taningco
Assistant Examiner — Seokjin Kim
(74) Attorney, Agent, or Firm — Adams Intellex, PLC

(57) ABSTRACT

Compact logic evaluation gates are built using null convention logic (NCL) circuits. The inputs to a null convention circuit include a NCL true input and a NCL complement input. The NCL circuit includes a gate coupled to the pair of inputs, where the gate comprises a plurality of transistors. The transistors allow for logical signal capture, provide a pair of cross-coupled inverters for data storage, and include a first and second pull-down device. The first pull-down device causes a first side of the pair of cross-coupled inverters to go to a "0" state when a "1" is applied to the NCL true input, and the second pull-down device causes a second side of the pair of cross-coupled inverters to go to a "0" state when a "1" is applied to the NCL complement input.

24 Claims, 10 Drawing Sheets

(56) References Cited

U.S. PATENT DOCUMENTS

| | | |
|---|---|---|
| 5,664,212 A | 9/1997 | Fant et al. |
| 5,764,081 A | 6/1998 | Fant et al. |
| 5,793,662 A | 8/1998 | Duncan et al. |
| 5,796,962 A | 8/1998 | Fant et al. |
| 5,805,461 A | 9/1998 | Fant et al. |
| 5,828,228 A | 10/1998 | Fant et al. |
| 5,896,541 A | 4/1999 | Fant et al. |
| 5,907,693 A | 5/1999 | Fant et al. |
| 5,930,522 A | 7/1999 | Fant |
| 5,977,663 A | 11/1999 | Fant et al. |
| 5,986,466 A | 11/1999 | Sobelman et al. |
| 6,020,754 A | 2/2000 | Sobelman et al. |
| 6,031,390 A | 2/2000 | Fant et al. |
| 6,043,674 A | 3/2000 | Sobelman |
| 6,052,770 A | 4/2000 | Fant |
| 6,128,678 A | 10/2000 | Masteller |
| 6,262,593 B1 | 7/2001 | Sobelman et al. |
| 6,275,841 B1 | 8/2001 | Potter et al. |
| 6,308,229 B1 | 10/2001 | Masteller |
| 6,313,660 B1 | 11/2001 | Sobelman et al. |
| 6,327,607 B1 | 12/2001 | Fant |
| 6,333,640 B1 | 12/2001 | Fant et al. |
| 6,526,542 B2 | 2/2003 | Kondratyev |
| 6,900,658 B1 | 5/2005 | Sobelman et al. |
| 7,053,662 B1 | 5/2006 | Silver et al. |
| 7,478,222 B2 | 1/2009 | Fant |
| 7,930,517 B2 | 4/2011 | Fant |
| 7,977,972 B2 | 7/2011 | Di et al. |
| 8,020,145 B2 | 9/2011 | Fant |
| 8,026,741 B2 | 9/2011 | Takayanagi |
| 8,078,839 B2 | 12/2011 | Fant |
| 8,086,975 B2 | 12/2011 | Shiring et al. |
| 2002/0075053 A1* | 6/2002 | Ganesan ............... H03K 3/0375 327/218 |
| 2006/0233006 A1 | 10/2006 | Fant |
| 2009/0204788 A1 | 8/2009 | Fant |
| 2013/0342253 A1* | 12/2013 | Chang ................. H03K 17/165 327/198 |

OTHER PUBLICATIONS

"Glitch-Free Design for Multi-Threshold CMOS NCL Circuits", by Al Zahrani, et al., GLIVLSI'09, May 10-12, 2009, Boston, Massachusetts, Copyright 2009 ACM 978-1-60558-522-2/09/05.

* cited by examiner

COMPACT LOGIC EVALUATION GATES USING NULL CONVENTION

RELATED APPLICATIONS

This application claims the benefit of U.S. provisional patent application "Compact Logic Evaluation Gates Using Null Convention" Ser. No. 62/080,287, filed Nov. 15, 2014. The foregoing application is hereby incorporated by reference in its entirety.

FIELD OF ART

This application relates generally to logic circuitry and more particularly to compact logic evaluation gates using null convention.

BACKGROUND

State-of-the-art, high-speed integrated circuits necessitate advanced manufacturing and electronic circuit technologies capable of supporting systems that include tens or hundreds of millions of active devices. These rigorous system requirements are driven by market demands for ever-increasing system performance, feature sets, and system capabilities. Logic circuits fall into two broad categories: circuits that are clocked or synchronous, and circuits that are self-timed or asynchronous. Many circuit families exist for each of these broad circuit classifications. The logic circuit family that is chosen for a particular system design has a significant and direct impact on a variety of factors such as system performance, circuit density, power consumption, current leakage, and heat dissipation, among many other circuit parameters. Null convention logic (NCL) offers compact circuit layout, effective logic signal detection, and storage using asynchronous logic circuits.

Traditional digital logic circuits include logic elements which are continuously asserting a valid result, such as a logical "1" or a logical "0". As new data is input to a traditional digital logic circuit, the result asserted by the circuit might change several times before stabilizing at the correct result. In a traditional digital logic circuit, the determination of completion can be accomplished by a reference outside of the logic circuit, such as a system clock. The external reference (e.g. system clock) can be used to indicate when the output of the circuit is in a valid state for evaluation. The system clock allows enforcement of the sufficient settling time for the logic circuit to stabilize at the correct result before declaring the output states to be valid and ready to be evaluated.

NCL differs from traditional digital (Boolean) logic, where each signal line may have one of two valid states. In traditional digital logic that uses a CMOS implementation, a low voltage level on a signal line means logical false or a "zero" value. A high voltage level on the same line means logical true or a "one" value. Thus a traditional digital logic signal may assume one of two values, both of which are valid.

NCL, however, includes a null state which has no meaning. For example, two separate signal lines can be used to convey two meaningful values. In this case, logic "false" would be conveyed by asserting a high voltage on the first line and a low voltage on the second line. Logic "true" can be conveyed by asserting a low voltage on the first line and a high voltage on the second line. A null state is conveyed by low voltage levels on both lines. Simultaneous high voltage levels on both lines are an invalid input state and are not used.

NCL has certain advantages over traditional digital logic. One such advantage is that the presence of a meaningful value at an NCL circuit output is sufficient to indicate that the circuit has completed intermediate logic operations and the output is valid for use by additional circuits. Therefore, with NCL, no external clock is required to indicate that output data is available for use. Nevertheless, as with any type of computation circuit, data integrity and validity are key components of an accurate and efficient logic evaluation system.

SUMMARY

Disclosed are systems and methods for increasing the performance of logic gates by implementing compact logic evaluation gates using null convention logic (NCL) circuits. In some embodiments, the evaluation comprises capturing NCL inputs into a storage element. NCL is a part of the asynchronous logic design family in that NCL does not require a centralized clock signal for logic timing control. Instead, additional information is added to a given data element so that the data element can self-indicate its own validity. Several families of NCL logic gates can be implemented, including a so-called 2NCL family. In a 2NCL family, signals are carried to an NCL gate, including a 2NCL gate, using a wire or rail. Each rail can have two distinct values called data and null. Both the data and null values can represent the binary values of 0 and 1. Multivalued versions of NCL logic including quad-valued logic can also be used. Arranging a plurality of transistors to form the NCL gates creates logic circuits. To use the logic circuits, a logic value of 0 or 1 is preceded by an empty value or null and is followed by an empty value or null. The transition from the logic value back to the null value can indicate that data is valid, that a logic operation has been completed, and so on.

NCL can be used to create storage circuits that can be read and written to in a pipelined manner such that previously written data is being read from an output of the storage circuit as new data is being written to an input of the storage circuit. Latches and completion circuits can be used to implement such features with a reduced number of logic gates. The reduction in logic gates results in reduced power consumption. Reduced power consumption is of particular importance in battery-powered devices such as mobile devices, tablet computers, portable instrumentation, and the like. As the trend towards more powerful and more mobile electronic devices continues, reduced power consumption and complexity are important factors for enabling the next generation of such devices.

A logic circuit can include a pair of inputs, where the pair of inputs comprise a NCL true input and a NCL complement input; a gate, coupled to the pair of inputs, comprised of a plurality of transistors where: the plurality of transistors provide for logical signal capture; the plurality of transistors include a pair of cross-coupled inverters; the plurality of transistors include a first pull-down device with a transistor-gate node coupled to the NCL true input; the plurality of transistors include a second pull-down device with a transistor-gate node coupled to the NCL complement input; a "1" on the NCL true input causes a first side of the pair of cross-coupled inverters to go to a "0" state; and a "1" on the NCL complement input causes a second side of the pair of cross-coupled inverters to go to a "0" state.

Various features, aspects, and advantages of various embodiments will become more apparent from the following further description.

BRIEF DESCRIPTION OF THE DRAWINGS

The following detailed description of certain embodiments may be understood by reference to the following figures wherein.

DETAILED DESCRIPTION

Figure 1:
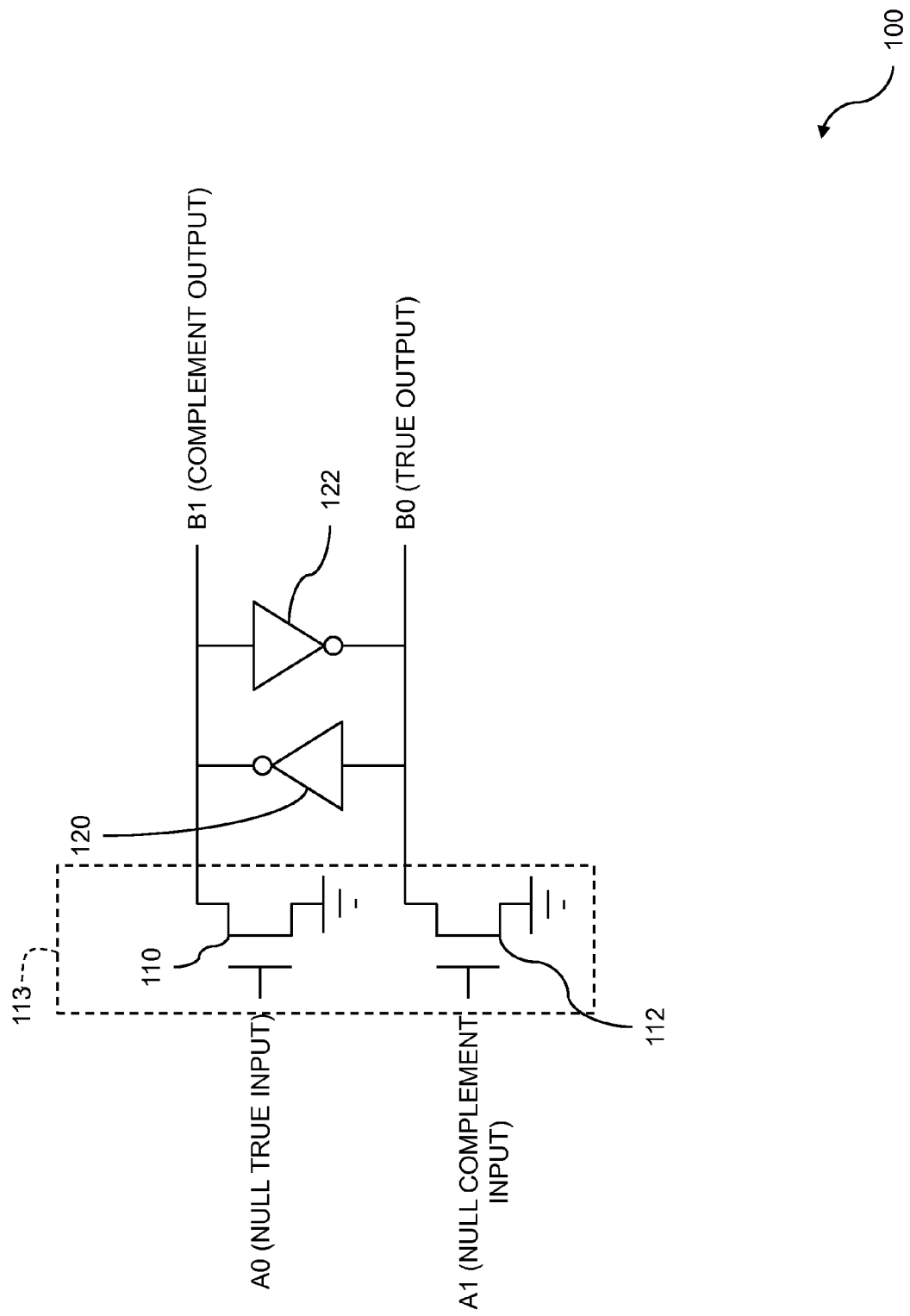
FIG. 1 is an example storage element for use with null convention logic.

The performance of electronic systems relies on the ability of the various transistors that make up the logic gates and other circuits in the electronic system to switch quickly and reliably. A centralized clock can be, and is often, used to orchestrate the flow of data and control signals throughout electronic systems. Such a design paradigm requires that clock signals and other control signals be widely distributed throughout the electronic system. The clock and control signals can be distributed using interconnect material at various physical layers of the integrated circuit that implements the system. Alternatively, the electronic system can be based on an asynchronous design paradigm. Implementing an asynchronous system obviates the need for wide distribution of a centralized clock signal by replacing the central, synchronizing clock with a family of logic circuits that can determine locally that a particular operation has been completed. The self-determining logic circuits can be constructed from asynchronous logic families including null convention logic (NCL) circuits. In the case of NCL logic designs, information is added to each data element such that the data element can represent binary data values of 0, 1, and a null value. At times, the two values, data and null, can be treated like binary values in order to evaluate Boolean expressions.

The forming of logic gates from a plurality of transistors is a common feature in the implementation of logic gates using both synchronous and asynchronous design paradigms. The plurality of transistors can be used to create logic functions including AND, NAND, OR, NOR, NOT, XOR, and XNOR functions, as well as others. Additionally, the plurality of transistors can be used to form more complex logic functions including other Boolean expressions as well as computational and storage elements.

NCL as an asynchronous logic family can be used to form any of these logical, computational, and storage elements. NCL logic uses two rails per bit to transfer data within the system. One rail being active can indicate that the bit has a logical value of "0," while the other rail being active can indicate that the bit has a logical value of "1." The two rails cannot both be active simultaneously, as this creates an illegal state within NCL logic. If both of the rails are inactive, then the NCL logic is in a null state. The clear advantage of such as setup is the ability of NCL gates to process sequences of data bits without the synchronization of a central clock by separating individual data bits by some period of elapsed time during which the input variables are empty (e.g. both rails are null).

A compact logic evaluation circuit using null convention logic can include a latch. The latch can include a cross-coupled inverter pair. The cross-coupled inverter pair can implement outputs that follow the values of the inputs, except when the inputs enter the reset state (i.e. preserve a value on the output even when both inputs are deasserted). In a reset state, the input pair signals (a true input and a corresponding complement input) are both deasserted (i.e. set low). However, the cross-coupled inverter pair serves to maintain the NCL outputs, allowing the output to be read by downstream circuitry. A more sophisticated embodiment utilizes an enable circuit to control a pull-down device in series with the input transistors. In such a design, a particular output value can be preserved, even if the input values change from the null state (both true and complement are deasserted) to a new data valid state. As an example, if a first data value of "1" is presented on the true input, and propagated to the true output, the enable circuit can be deasserted until the output data is read. While the enable circuit is deasserted, the output values do not change and remain latched at the previous values. This is true even if the input data changes to a valid "0" level, with a corresponding "1" on the complement input. Once a downstream circuit has read the output values, NCL allows the enable signal to be asserted and the output signals to be updated with the new input values.

In addition to the compact logic evaluation circuit using a latch, a completion circuit can also be used to provide a completion (or "data ready") signal. The completion circuit provides a convenient way for a designer to utilize an indication of when data is available for reading at the output of an NCL circuit. This is particularly useful for NCL implementations, since the NCL is unclocked logic with timing handled locally. The completion circuit can be designed such that when both inputs (true and complement) of the NCL circuit are deasserted (low), the completion signal is also forced to a deasserted (low) state. Once the NCL inputs are in a valid data state, the completion signal is asserted. The valid data state could be a "1, 0" state, meaning the true value is "1" and the complement value is "0." Alternatively, the valid data state could be a "0, 1" state, meaning the true value is "0" and the complement value is "1."

The completion circuit can be used in conjunction with latch circuits to make a read circuit. The read circuit can include an input signal, one or more read signals, and a complementary set of output signals. In some cases, the read signals can be complementary read signals. With such a read circuit, the changing of the output data is controlled by the arrival of new input data combined with the control of the read signals, without the need for any external synchronization clocks. The read circuit can be combined with additional logic circuitry (both NCL and traditional digital logic) to make a control circuit that includes a write stage, a read stage, and a completion circuit. Disclosed embodiments provide a reduced gate count compared with previous designs. Additionally, the disclosed circuitry only consumes active power when it is actually read or written. Furthermore, if the value written is unchanged from the previous value, then active power is only consumed in a completion circuit section of the circuit. Thus, the circuits, methods, and designs described herein simplify the use of NCL in circuit designs and provide a reduced gate count, thereby enabling reduced cost and reduced power consumption in electronic devices.

FIG. 1 is an example storage element for use with NCL. A circuit 100 is shown for implementing a write stage of a latch. The write stage of the latch can include a pair of inputs, where the pair of inputs can include a NCL true input and a NCL complement input. The inputs can be labeled with a "0", such as A0 for the logic true input, and a "1", such as A1 for the logic complement input. Similarly, the outputs can be labeled with a "0", such as B0 for the logic true output, and a "1", such as B1 for the logic complement output. A write stage can store data including a Boolean value in a latch, where the latch can be a D-latch, an SR-latch, a JK-latch, and so on. The write stage of a latch can include a gate, coupled to the pair of inputs, comprised of a plurality of transistors. The transistors can include N-FET or NMOS transistors, P-FET or PMOS transistors, and so on. The transistors can be implemented as planar transistors, fin-type field effect transistors (finFET devices), or a combination thereof. Furthermore, embodiments include bulk substrate technology, and/or semiconductor-on-insulator (SOI) technology. The plurality of transistors can provide for logical signal capture of logical signals that are input to the write stage 113 of the latch. A logical signal can be an NCL signal and can include true and complement versions of the signal. The plurality of transistors can include a pair of cross-coupled inverters 120 and 122. The transistors can form an inverter in various logic families. The cross-coupled inverters can serve to store a logical bit for later reading or other purposes. The plurality of transistors can include a first pull-down device with a transistor-gate node coupled to the NCL true input 110. The first pull-down device can be used to help provide a logical value that can be stored on the cross-coupled inverters, to set the logical value on the cross-coupled inverters, and so on. The pair of cross-coupled inverters can retain a value based on the last previous non-null value applied to the pair of inputs. The plurality of transistors can include a second pull-down device with a transistor-gate node coupled to the NCL complement input 112. Similar to the first pull-down device, the second pull-down device can be used to change and set the logical value stored on the cross-coupled inverters.

As an example of the operation of the write latch 100, a "1" on the NCL true input can cause a first side of the pair of cross-coupled inverters to enter a "0" state. For example, a "1" connected to the input of the pull-down element 110 can cause the input of the second inverter 122 to be "0" and the output of the second inverter 122 to be "1," and the input of the first inverter 120 to be "1" and the output of the first inverter 120 to be "0." Thus, the cross-coupled inverters hold a "0" state. A "1" on the NCL complement input can cause a second side of the pair of cross-coupled inverters to go to a "0" state. For example, a "1" connected to the complement input 112 can cause the second side of the cross-coupled inverted to enter a "0" state, as described in the example above. Again, the cross-coupled inverters can hold this second state.

The write latch 100 can follow the NCL convention of ignoring an empty input (when A0 and A1 are both null) and preserving the saved value in B0 and B1. When the input value at A0 or A1 is either "0" or "1", the circuit can quickly reflect the state of its nonempty input and can produce an output value to match the input value. The write stage of a latch 100 uses cross-coupled inverters 120 and 122 to store a complementary Boolean value of a last write operation. The rails, B0 (true output) and B1 (complement output), are the outputs of a latch circuit. The signals or rails, A0 (null true input) and A1 (null complement input), are the input signals or rails to the latch. When one of the input rails A0 or A1 is a logic high value, then the respective N-type FET (NFET) transistor (also called NMOS) 110 or 112, respectively, can be enabled. In embodiments, the logic high value is represented by a positive reference voltage, such as 3.3 volts, or another suitable reference voltage value. The enabling of one of the NMOS transistors, 110 or 112, can cause one of the output signals B1 or B0 to be pulled low, and the other output signal B1 or B0 to be pulled high. The result of the pulling low of the one output signal and the pulling high of the other output signal can be the storage of the written Boolean value on the cross-coupled inverters 120 and 122. When one of the input signals, either A0 or A1, that was a logic high value returns to a null value, the latch is not affected and retains its previous state.

The logic circuit can further comprise a first output of the gate indicative of a logic state being stored by the pair of cross-coupled inverters. For the example circuit 100, an output B0 that can be a true output of the logic circuit is included. The logic state output by the circuit 100 can be a logic "1" or a logic "0," for example. The logic circuit can further comprise a second output of the gate indicative of the logic state being stored by the pair of cross-coupled inverters. The second output can include an output B1, which can be a complement output of the logic circuit. The first output B0 and the second output B1 can be inverses of each other. The NCL true input A0 and the NCL complement input A1 can have valid data values of "0, 1" and "1, 0" indicating a logic "0" and a logic "1," respectively. In practice, while only one input pair (true and complement) is shown, more than one signal can be input to an NCL logic gate, thus supporting more complex logical operations. For example, in some embodiments, three input signals are present. In other embodiments, four input signals are present. The NCL true input and the NCL complement input can have values of "0, 0" to indicate a null condition. In the case of a null condition, the NCL logic gate does not evaluate the true and complement inputs and the true and complement outputs of the NCL logic gate remain unchanged. The NCL true input and the NCL complement input can have values of "1, 1" and can thus indicate an invalid condition. Having both the true and the complement inputs set to values of "1" signals invalid data and is not allowed.

Figure 2:
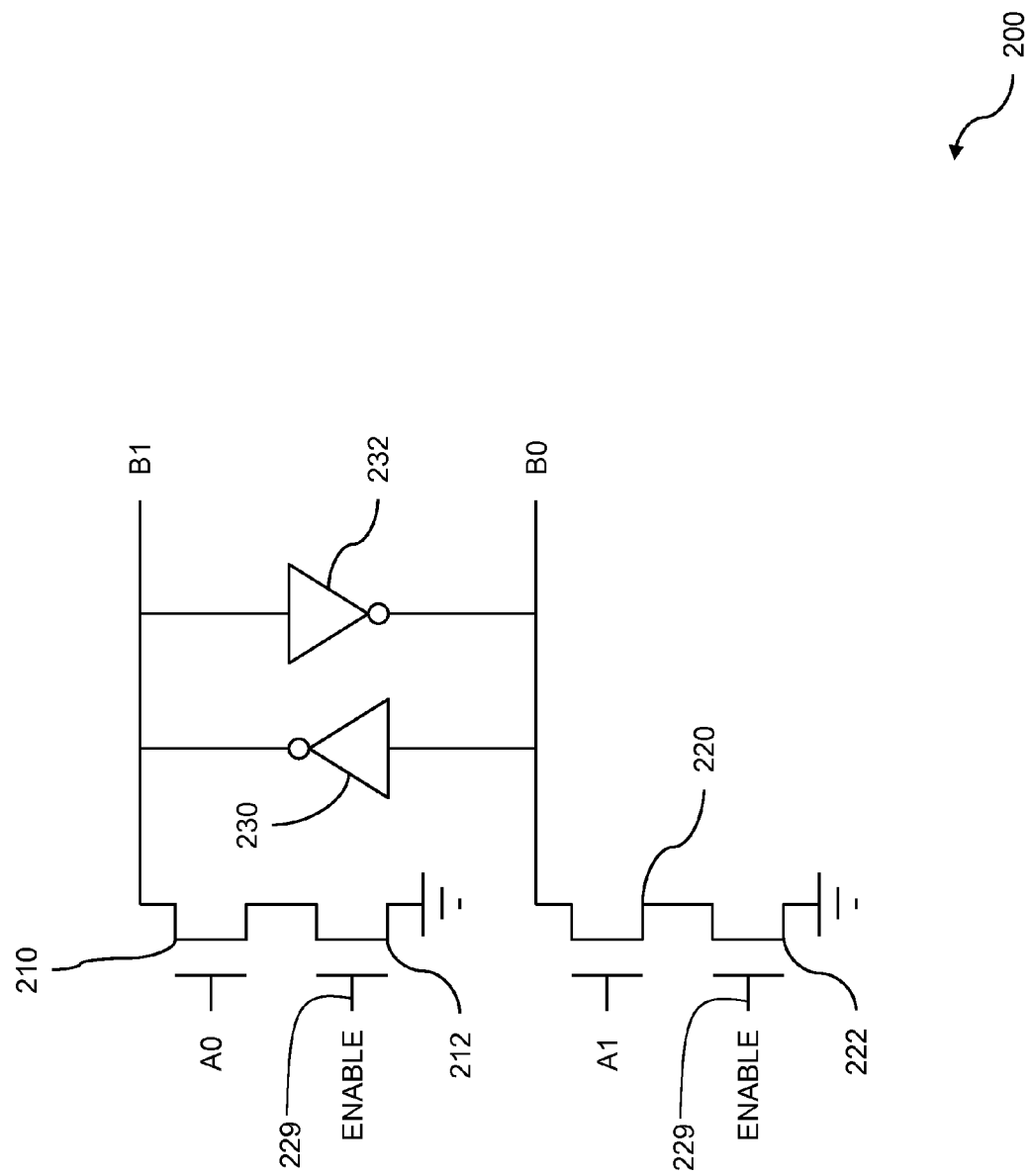
FIG. 2 is an example storage element for use with null convention logic with an enable input.

FIG. 2 is an example storage element for use with NCL with an enable input. A circuit 200 is shown for implementing a write stage of a latch. A write stage stores data, including a Boolean value in a latch, where the latch can be a D-latch, an SR-latch, a JK-latch, and so on. The write stage of the latch can include a plurality of transistors. The plurality of transistors can include provisions for logical signal capture, cross-coupled inverters, pull-down devices, and so on. The plurality of transistors can further include a third pull-down device 212 in series with a first pull-down device 210, where the transistor-gate node of the third pull-down device 212 is coupled to an enable signal. When the enable signal is true, then the third pull-down device 212 is on and the first pull-down device 210 will turn on or remain off, depending on the value of the input A0. The plurality of transistors can further include a fourth pull-down device 222 in series with a second pull-down device 220, where the transistor-gate node of the fourth pull-down device 222 is coupled to the enable signal. When the enable signal is true, then the fourth pull-down device 222 is on and the second pull-down device 220 will turn on or remain off, depending on the value of the input A1. As seen in the circuit 200, the enable signal can allow propagation of the NCL true input A0 and the NCL complement input A1 to the pair of cross-coupled inverters. The outputs B1 and B0 can be set depending on which pair of pull-down devices is enabled, either the first pair 210 and 212 or the second pair 220 and 222. For example, if the input A0 and the enable signal are both "1," then the output B1 is set to "0" and the output B0 is set to "1". The cross-coupled inverters 230 and 232 then hold these values. Alternatively, if the input A1 and the enable signal are both set to "1," then the output B1 is set to "1" and the output B0 is set to "0".

The write stage of a latch can use the cross-coupled inverters 230 and 232 to store a complementary Boolean value of a last write operation. The rails B1 and B0 can be the outputs of the latch circuit 200. The signals or rails A0, A1, and enable 229, are the input signals, or rails, to the latch. When the enable signal 229 is a logic high value, then the NFET or NMOS transistors 212 and 222 are enabled. When one of the input rails A0 or A1 is a logic high value, then one of the NMOS transistors 210 or 220, respectively, is enabled. The enabling of one pair of the NMOS transistors, either the first pair 210 and 212 or the second pair 220 and 222, causes one of the output signals B1 or B0 to be pulled low and the other output signal B1 or B0 to be pulled high. The result of the pulling low of one output signal and the pulling high of the other output signal is the storage of a written Boolean value on the cross-coupled invertors 230 and 232. When one of the input signals A0 or A1 that was a logic high value returns to a null value and/or the enable signal returns to a logic low value, the latch is not affected and retains its previous state.

Figure 3:
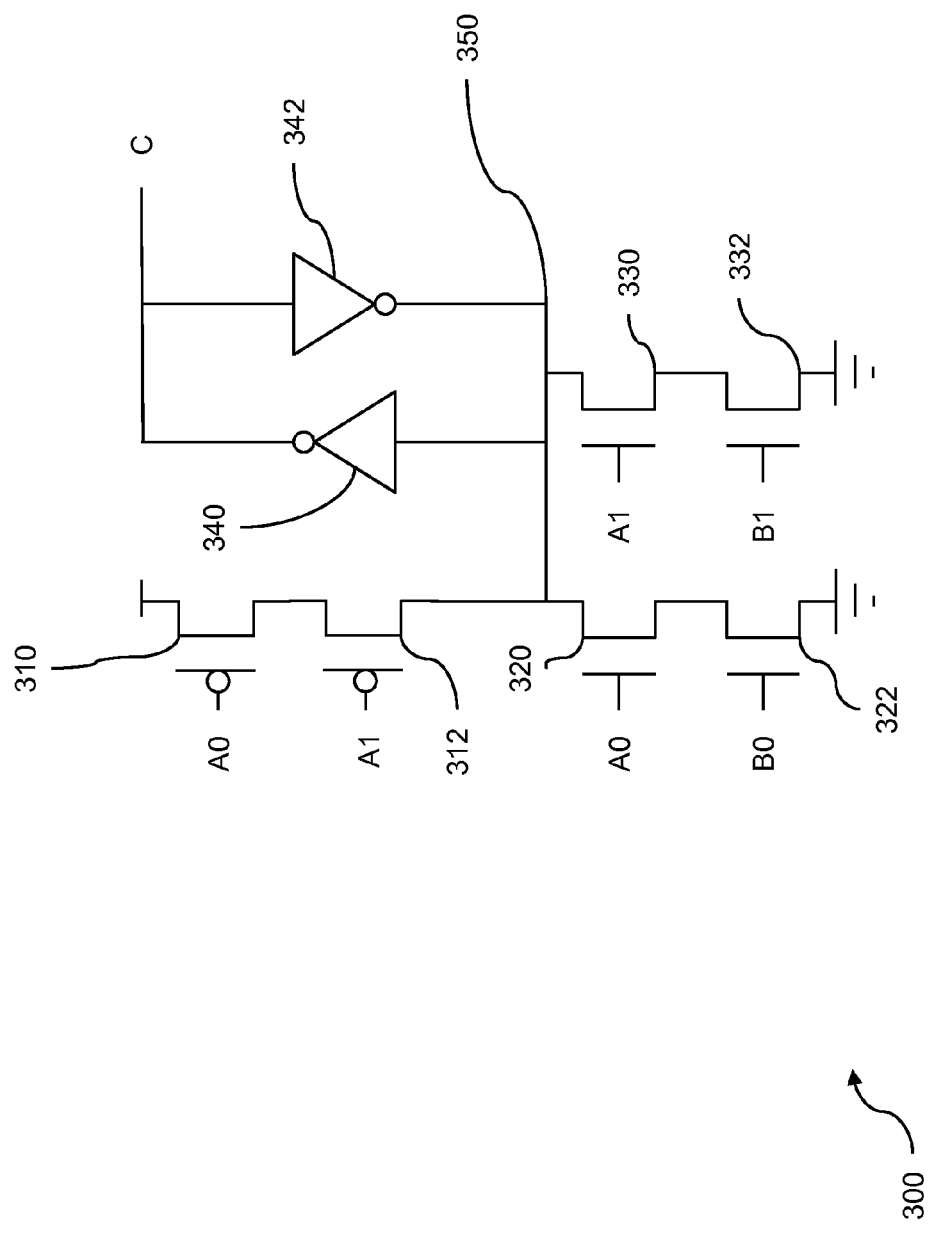
FIG. 3 is an example completion circuit for null convention logic.

FIG. 3 is an example completion circuit for NCL. A circuit 300 is shown for determining a completion of a write operation to a latch. The completion circuit can include a plurality of transistors. The plurality of transistors can include provisions for logical signal capture, cross-coupled inverters, pull-up devices, pull-down devices, and so on. The plurality of transistors can further include a third pull-down device 322 in series with a first pull-down device 320, where the transistor-gate node of the third pull-down device 322 is coupled to a further NCL input. In the example shown, the third pull-down device 322 can be coupled to a second NCL input B0. The first pull-down device 320 and the third pull-down device 322 provide for NCL calculation. For example, both the inputs A0 and B0 can be a logic "1" in order to cause an intermediate node 350 to be pulled low to a logic "0." The plurality of transistors can further include a fourth pull-down device 332 in series with a second pull-down device 330, where the transistor-gate node of the fourth pull-down device 332 is coupled to a further NCL input. In the example shown, the fourth pull-down device 332 can be coupled to a further NCL input B1. The second pull-down device 330 and the fourth pull-down device 332 provide for NCL calculation. As described above, NCL calculation can include Boolean calculations such as AND, NAND, OR, NOR, XOR, XNOR, sum of productions, and so on. In embodiments, the second pair of inputs (B0 and B1) are outputs of a latch such as that shown in FIG. 1 and/or FIG. 2. Thus, the values of A0 and B0 can be similar and the values of A1 and B1 can be similar. (In some embodiments, a connection can couple the node between pull down transistors 320 and 322 with the node between pulldown transistors 330 and 332. In this case, A0 could be high and B1 could be high, causing node 350 to pull low. Likewise, A1 could be high and B0 could be high, causing node 350 to pull low. Similar connections and logic can be implemented to cause proper completion evaluation determinations to be made.) With such a configuration, the completion signal C is deasserted when both inputs A0 and A1 are null, and the completion signal C is asserted when one rail of the input A (A0 or A1) is asserted and that value has propagated to its corresponding output rail (e.g. B0/B1 as shown in FIG. 1 or FIG. 2).

A write operation to a latch such as the latch 100 shown in FIG. 1 and a latch with an enable signal 200 as shown in FIG. 2 requires a finite amount of time to complete. The detection of the completion of a write operation can indicate that a sufficient time period has elapsed for the successful completion of the write operation. The completion circuit 300 can produce an output C that is comprised of valid data when a latch 100 or a latch with an enable signal 200 has saved a non-null state at its input. The producing of the output C can provide an acknowledgment signal to the source of the input to the latch (e.g. signals A0 and A1 in FIG. 1 or FIG. 2). The source of the input to the latch can then make the input empty (i.e. the "0 0" state) and prepare to supply another input value. When the signals A0 and A1 are both equal to a logic low value, then the intermediate node 350 is pulled to a logic high value through the PMOS transistors 310 and 312, and the completion output C becomes a logic low value because of an inverter 340. The logic low value of the completion output C is stored on cross-coupled inverters 340 and 342. When either of the inputs A0 or A1 becomes data (i.e. not a null value), then the completion detection circuit 300 will evaluate when to read the respective output B0 or B1 of the latch (such as 100 of FIG. 1 or 200 of FIG. 2). For example, if the input A0 is a logic high value, then the output B0 becoming a logic high value causes the intermediate node 350 to be pulled to a logic low value through the NMOS transistors 320 and 322. The inverter 340 causes the completion output C to become a logic high value, and the cross-coupled inverters 340 and 342 will hold the completion output at the logic high value. Similarly, if the input A1 is a logic high value, then the output B1 becoming a logic high value causes the intermediate node 350 to be pulled to a logic low value through the NMOS transistors 330 and 332. The inverter 340 causes the completion output C to become a logic high value, and the cross-coupled inverters 340 and 342 will hold the completion output at the logic high value. When the inputs A0 and A1 return to the null logic value, the circuit 300 will cause the output C to signal a logic null value.

Figure 4:
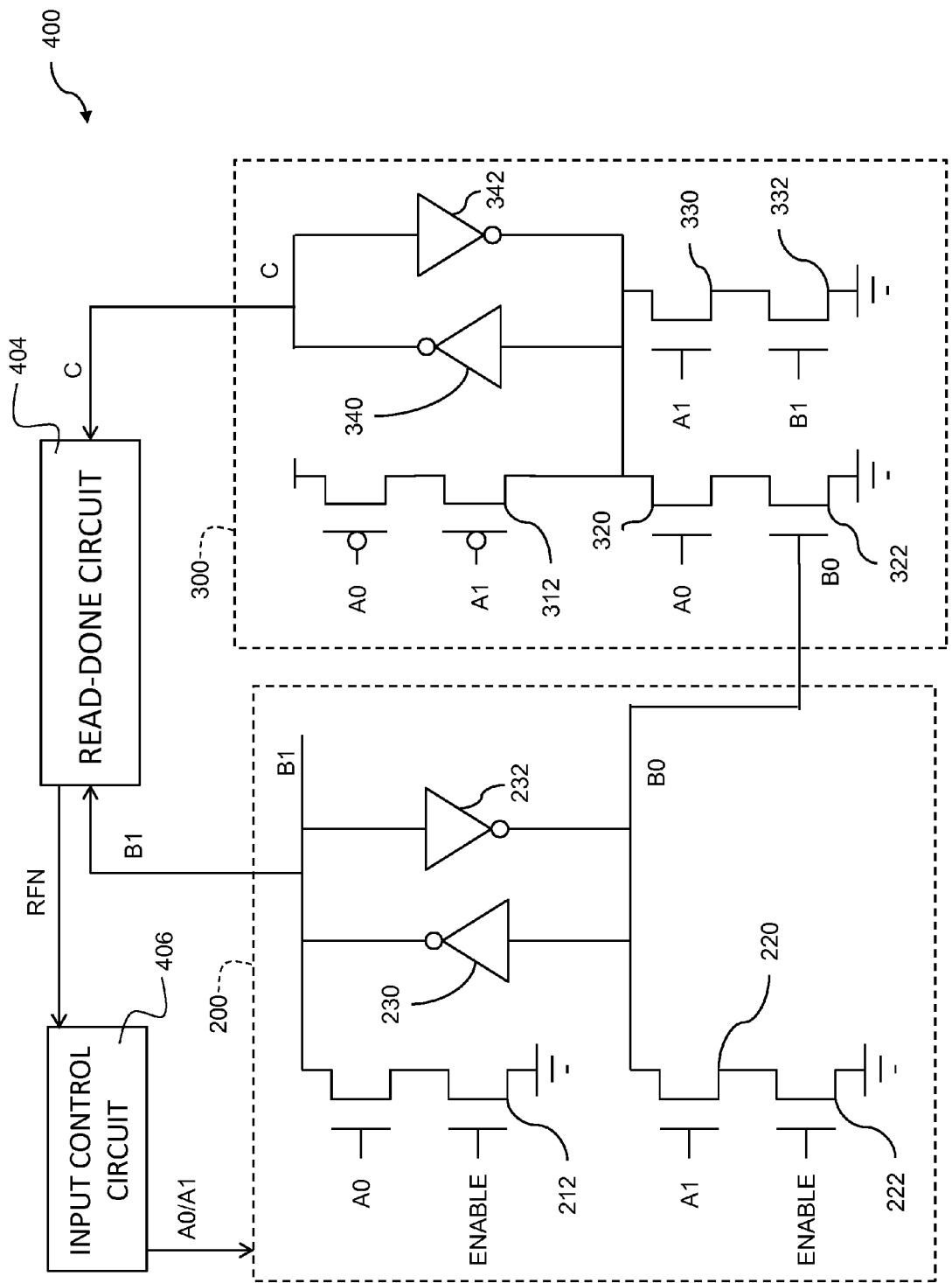
FIG. 4 shows an exemplary null convention logic circuit comprising a latch and a completion circuit.

FIG. 4 shows an exemplary null convention logic circuit 400 comprising a latch and a completion circuit. The circuit 400 includes a latch circuit 200 which is similar to that shown in FIG. 2. The latch circuit 200 interfaces to a completion circuit 300, which is similar to that shown in FIG. 3. An output B0 of the latch circuit is illustrated to show connection as an input to the completion circuit. For the sake of clarity, not all electrical connections between the latch circuit 200 and completion circuit 300 are shown. Like labels indicate like signals; thus, for example, a signal B1 from the latch circuit 200 is connected to the completion circuit 300 at a pull-down device 332 a signal A1 from the latch circuit 200 is connected to the completion circuit 300 at a pull-down device 330, and so on. A completion signal C is an input to a read-done circuit 404. When the completion signal C is asserted, the read-done circuit 404 can safely read the data from B1. Once the read is complete, the read-done circuit 404 can assert a ready-for-next (RFN) signal which is fed to an input control circuit 406. In response to the ready-for-next signal, the input control circuit 406 can perform functions to prepare for a new data value at the inputs of the latch circuit 200. The functions can include, but are not limited to, deasserting the enable signal of the latch circuit 200. Then, the inputs A0 and A1 can be set to a null state. This causes the completion signal C to deassert. Next, the inputs A0 and A1 can be set to new values and the enable signal of the latch circuit can be reasserted. This causes the new value to propagate to the B0/B1 signals. Once the new value is present on the B0/B1 signals, the completion signal C asserts, and the cycle continues. In this way, data is propagated through circuit 400 without the need for a synchronized clock.

Figure 5:
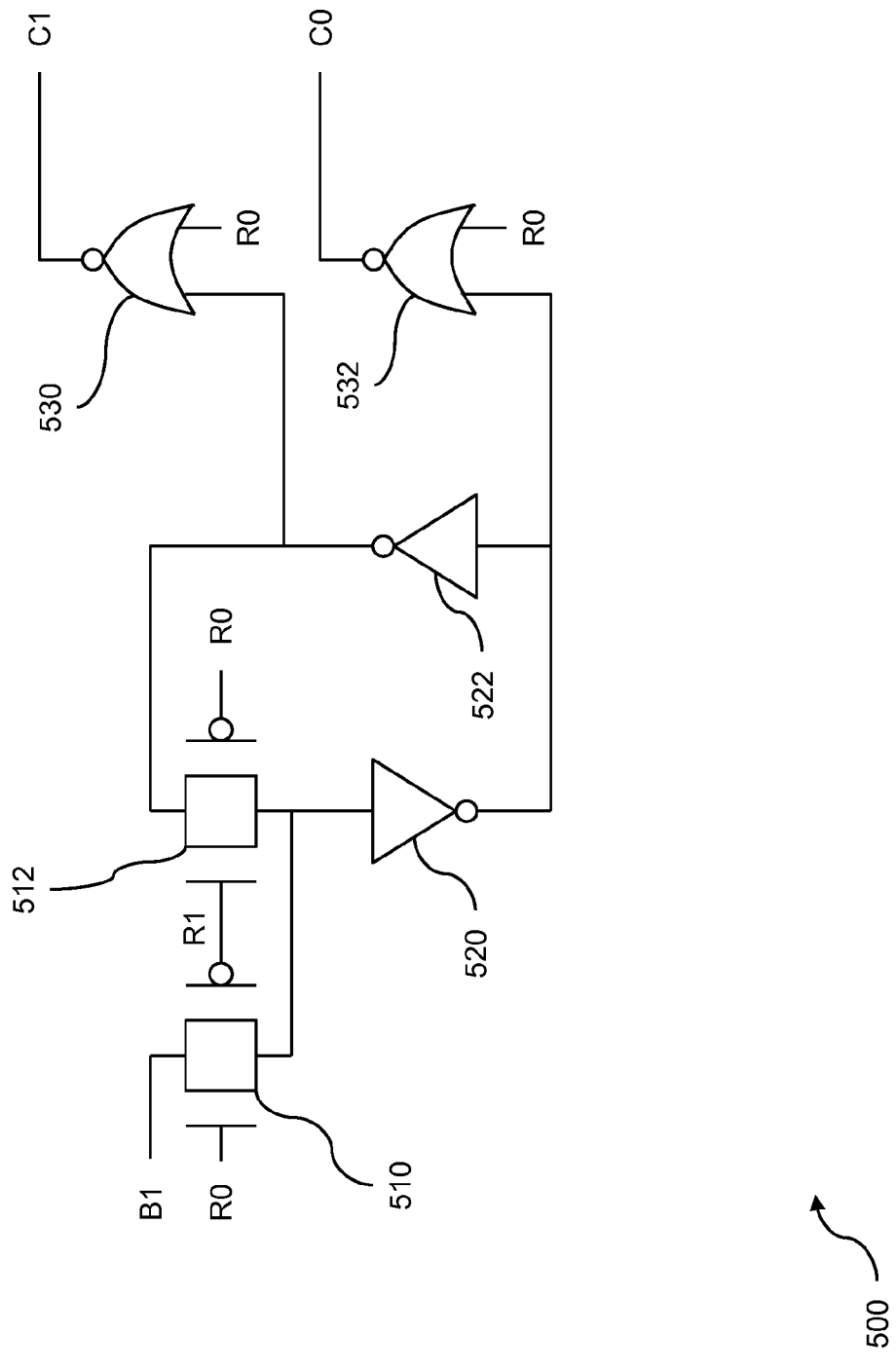
FIG. 5 is an example read stage for a storage element.

FIG. 5 is an example read stage for an NCL storage element. A circuit 500 is shown for implementing a read stage of a latch. The read stage provides an output compatible with NCL logic. A read stage determines data including a Boolean value that is stored in a latch, where the latch can be a D-latch, an SR-latch, a JK-latch, and so on. A read circuit can be coupled to a pair of cross-coupled inverters 520 and 522 that can provide a NCL true output and a NCL complement output. The NCL true and complement outputs can include logical values "1" and "0" and can include a null value. A read-done circuit, coupled to the read circuit, can indicate when a read of the pair of cross-coupled inverters can be accomplished within a NCL environment. The read-done circuit can be asynchronous and can depend solely on input values to determine whether the read operation has completed.

The read stage 500 includes two transmission, or T-gates, 510 and 512. A transmission gate includes an NMOS transistor and a PMOS (P-type MOS) transistor in parallel and performs as an SPST switch. The read stage 500 reads in a new value B1 through the transmission gate 510 when the transmission gate 510 is enabled by the read signals R0 and R1. The R0 node can be in a "1" state when data B1 is read and the R1 node can be in a "0" state during the reading of the same data. The read stage 500 includes the two inverters 520 and 522 that can be connected as a cross-coupled pair through the transmission gate 512 or can be disconnected from each other by the transmission gate 512. The read stage further includes the two NOR gates 530 and 532. The read stage stores the last data value B1, including a Boolean data value that was written to the write stage. The NOR gates 530 and 532 produce the last value written to the write stage at the outputs of the read stage C1 and C0. The outputs C1 and C0 can be produced when the read enable signals R0 and R1 are configured accordingly. For example, to read the outputs C1 and C0, the signal R0 can be deasserted and the signal R1 can be asserted. The deasserting of the read signal R0 can block any changes in the input signal B1 from propagating through the read stage when a read operation is in progress. While the signal R0 is deasserted, the asserting of the read signal R1 during a read of the outputs C1 and C0 engages the cross-coupled inverter pair 520 and 522 to further stabilize the outputs C0 and C1.

The outputs C0 and C1 both return to a "0" condition when R0 is asserted (i.e. set to a "1") so that C0 and C1 operate following NCL protocol. In embodiments, the cross-coupled inverters are omitted, and the transmission gates are omitted. Likewise, various other logic embodiments can be used to implement functions comparable to the NOR gates in the read stage 500.

Figure 6:
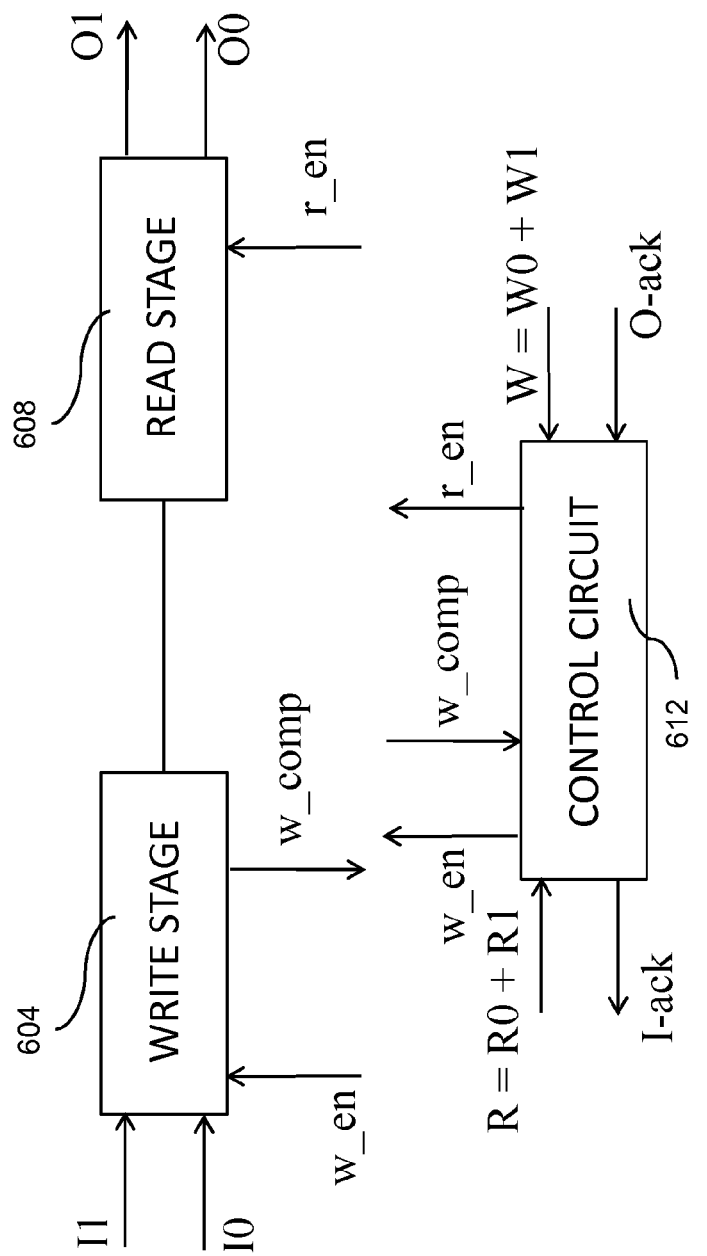
FIG. 6 is a block diagram of an NCL circuit including a write stage, read stage, and control circuit.

FIG. 6 is a block diagram of an NCL circuit including a write stage 604, a read stage 608, and a control circuit 612. The control circuit 612 enforces NCL cycle behavior. The control circuit 612 enables a read if requested by R, then enables a write if requested by W. Then, the read stage 608 becomes null, followed by the write stage 604 becoming null, and the process starts over again. The control circuit 612 ensures that the read stage cannot become null until a w_comp signal becomes true to indicate write completion. The control circuit 612 controls the read stage operation by controlling the read enable (r_en) signal. The control circuit controls the write stage operation by controlling the write enable (w_en) signal. The control circuit also receives the write completion signal (w_comp) from the write stage 604, and can in turn control the read stage 608 in response to receiving the write completion signal. The control circuit 612 can also receive an O-ack signal, which is an acknowledgement from downstream logic that output from the register has been received into the next stage. The control circuit 612 can also generate an I-ack signal to indicate that input data has been received into the write stage 604. The I-ack signal can be asserted based on the receiving of the w_comp signal by the control circuit 612.

Figure 7:
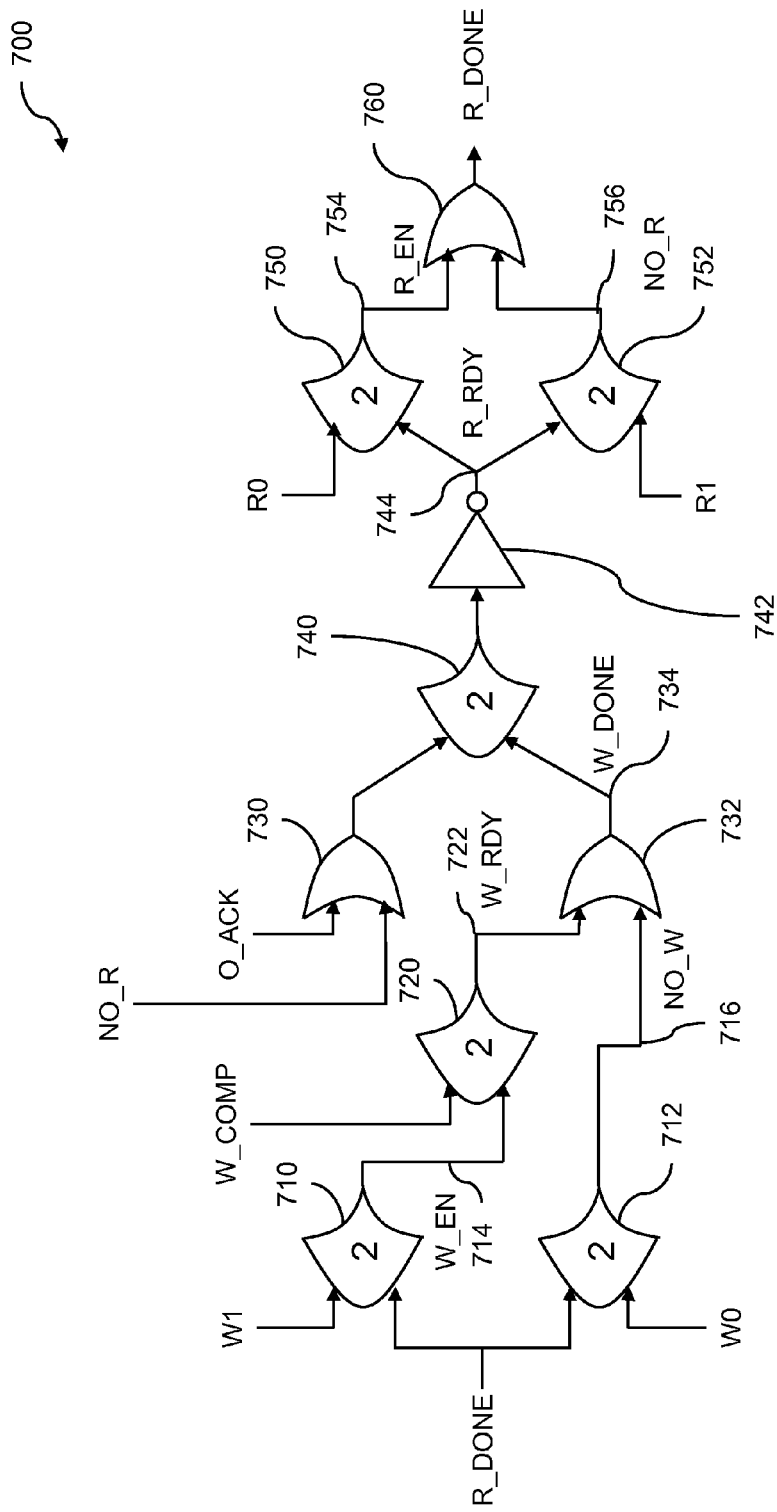
FIG. 7 shows details of an example control circuit for null convention logic.

FIG. 7 shows details of an example control circuit for NCL. A circuit 700 is shown for controlling NCL pipeline circuitry. This control circuit can be used in conjunction with registers and surrounding logic. The circuitry can include a write stage, a completion circuit, a read stage, and so on. In some practical uses of circuitry, new data can be written into a register cell during the same system cycle that previously stored (old) data is read out. In embodiments, a latch implemented as a pair of cross-coupled inverters (such as 340 and 342 of FIG. 3) can serve as a register cell and can store a value. The control circuit can time the operation of the register cell such that the old data is held long enough to be read from the register cell before the new data is written to the register cell. The control circuit can enforce an NCL cycle behavior on the register cell. The control circuit can include a plurality of NCL gates 710, 712, 720, 740, 750, and 752. Other varieties of logic gates can be included in the control circuit, where the logic circuits can include NAND gates, AND gates, NOR gates, OR gates, NOT gates, inverters, etc. The example control circuit 700 shown includes an inverter or NOT gate 742 and three OR gates 730, 732, and 760. An NCL cycle can include a read, a write, a wait for a read to become null, and a wait for a write to become null. The example control circuit 700 can first enable a read operation, if so requested by a read request where R0 goes to a "0" and R1 goes to a "1." Following a read operation, the control circuit can enable a write operation if so requested by a write request, an operation which can include W1="1" and W0="0." Continuing the example, the read inputs can return to a null state after an elapsed time period. Following the read inputs returning to a null state, the write inputs can return to a null state as well. Then, after the write circuit inputs have returned to a null state, the NCL cycle can repeat. The read state cannot return to a null state until a w_ready signal 722 becomes true. The w_ready signal 722 becoming true can indicate that the write cycle has completed. For design cases where the read signal is always true or the write signal is always true, then the logic of the control circuit can be simplified.

Initially, the r_ready signal 744 is data. If R0 is data, the no_r signal 756 is data and r_done is data. If R1 is active, the r_en signal 754 is data, allowing the saved data to flow to the register output, and r_done is again data. The signal r_done indicates that any read that was necessary has been completed. If the circuitry is writing (W1 is active) the write-enable signal w_en 714 is set, and when the new value is available and saved, the completeness signal w_comp sets the w_ready signal 722. If the circuitry is not writing, the no_w signal 716 is set. Either the signal w_ready 722 or the signal no_w 716 sets the signal w_done 734. If there was no read requested, or if the value has been read and the value read has been acknowledged, and if any w_done signal 734 is data, the signal r_ready 744 is set to null. When R (R refers to the NCL pair of R0 and R1) becomes empty, the read data becomes null and the register output becomes empty (if the register was read), eventually rendering O-ack null. When W (W refers to the NCL pair of W0 and W1) becomes empty and w_comp becomes null, then the w_done signal 734 is null as well. This makes the input to the inverter that drives the r_ready signal 744 null, so the r_ready signal 744 becomes data, and the cycle begins again.

Figure 8:
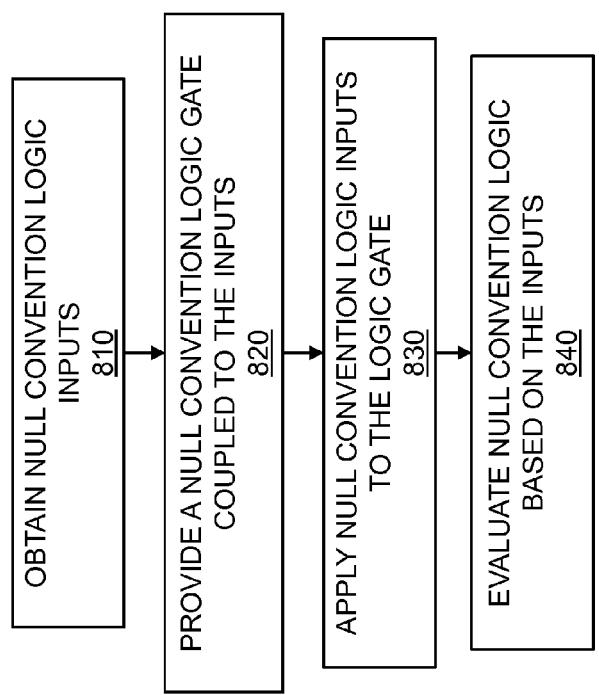
FIG. 8 is a flow diagram for null convention logic circuit evaluation.

FIG. 8 is a flow diagram 800 for a computer-implemented method for using a null convention logic implementation. The flow 800 starts with obtaining null convention logic inputs 810. The logic inputs can be in pairs, with a true rail (signal) and a complement rail (signal). The true rail and complement rail can both be set to a logical 0 while in a reset state. When valid input data is available, one of the rails is set to a logical 1, while the other rail is set to a logical 0. The flow 800 continues with providing a null convention logic gate coupled to the inputs 820. The null convention logic gate can have an input pair comprising two inputs (a true and a complement), and can similarly comprise two outputs (a true and a complement). In some embodiments, the null convention logic gate has additional inputs. In some embodiments, the null convention logic gate further includes a reset signal that sets the output of the null convention logic gate to a null state ("0 0") regardless of the inputs to the null convention logic gate. The flow 800 continues with applying the null convention logic inputs to the logic gate 830. The flow 800 continues with evaluation of the null convention logic based on the inputs 840. The gate has at least one pair of null convention logic outputs. The outputs can have a state that is based on the inputs, and the outputs can be latched such that further changes to the inputs do not affect the state of the outputs. A completion circuit can be included that provides a completion signal when the outputs agree with the state of the inputs. Another circuit, such as a read-done circuit, can utilize the output of the completion circuit to determine when it is safe to read the outputs. The completion circuit can assert a completion signal to indicate this condition, meaning that the NCL output is in a data state where the true and complement rails are set to different values ("1 0" or "0 1"). Once the outputs have been read, the inputs can be set to a null state ("0 0") which causes a deassertion of the completion signal.

Embodiments can include a computer-implemented method for using a logic implementation comprising: obtaining a pair of inputs where the pair of inputs comprises a null convention logic true input and a null convention logic complement input; applying the null convention logic true input to a null convention logic true input of a null convention logic gate; applying the null convention logic complement input to a null convention logic complement input of the null convention logic gate; and evaluating outputs for the null convention logic gate based on the null convention logic true input and the null convention logic complement input. Various steps in the flow 800 may be changed in order, repeated, omitted, or the like without departing from the disclosed concepts. Various embodiments of the flow 800 may be included in a computer program product embodied in a non-transitory computer readable medium that includes code executable by one or more processors.

Figure 9:
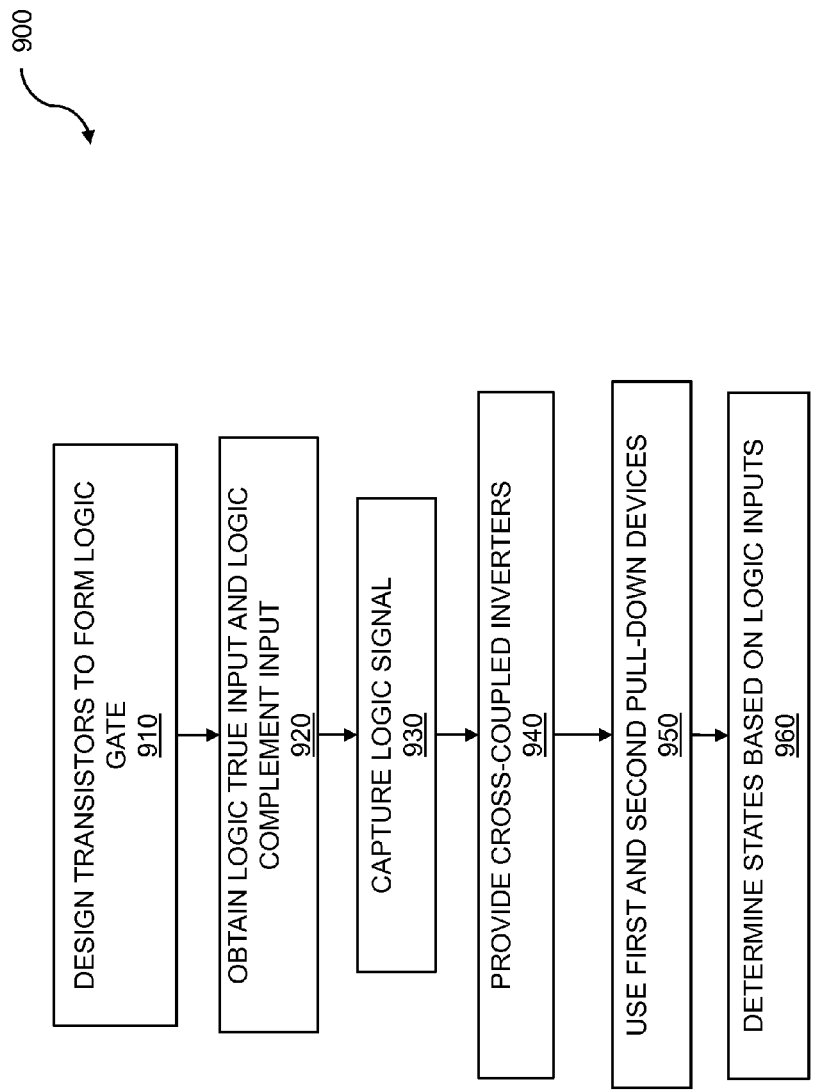
FIG. 9 is a flow diagram for design of a null convention logic circuit.

FIG. 9 is a flow diagram 900 for a computer-implemented method for logic implementation. The flow 900 includes designing transistors to form a logic gate 910. The transistors can include N-FET or NMOS transistors, P-FET or PMOS transistors, and so on. The transistors can be implemented as planar transistors, fin-type field effect transistors (finFET devices), or a combination thereof. Furthermore, embodiments include bulk substrate technology and/or semiconductor-on-insulator (SOI) technology. The flow 900 continues with obtaining a null convention logic true input and a null convention logic complement input 920. The flow 900 continues with the capture of a logic signal 930. The logic signal can be a null convention logic input signal. The flow 900 continues with providing cross-coupled invertors 940. The cross-coupled inverters can be used to latch a null convention logic output value. The flow 900 further includes using first and second pull-down devices 950. The first pull-down device and second pull-down device can be implemented as N-FET or NMOS transistors. The first pull-down device can be used to receive a true input of a null convention logic input pair. The second pull-down device can be used to receive a complement input of a null convention logic input pair. The flow 900 continues with determining states based on logic inputs 960. The determining of states can include reading one or both null convention logic output signals from a null convention logic output pair. In some embodiments, only one signal (e.g. the true or the complement) is read, since the state of one signal of the pair can be derived if the value of the other signal of the pair is known. The determining of states can further include utilizing a completion signal provided by a completion circuit for an indication of when the states of NCL outputs have stabilized and can safely be evaluated. Once the NCL outputs are evaluated, an input control circuit can set NCL inputs to a null state, causing deassertion of the completion signal, and preparing the circuit for the next input data.

Embodiments can include a computer-implemented method for logic implementation comprising: designing a plurality of transistors to form a logic gate wherein: the logic gate includes a pair of inputs where the pair of inputs comprises a null convention logic true input and a null convention logic complement input; the logic gate is coupled to the pair of inputs wherein: the plurality of transistors provides for logical signal capture; the plurality of transistors includes a pair of cross-coupled inverters; the plurality of transistors includes a first pull-down device with a transistor-gate node coupled to the null convention logic true input; the plurality of transistors includes a second pull-down device with a transistor-gate node coupled to the null convention logic complement input; a "1" on the null convention logic true input causes a first side of the pair of cross-coupled inverters to go to a "0" state; and a "1" on the null convention logic complement input causes a second side of the pair of cross-coupled inverters to go to a "0" state. Various steps in the flow 900 may be changed in order, repeated, omitted, or the like without departing from the disclosed concepts. Various embodiments of the flow 900 may be included in a computer program product embodied in a non-transitory computer readable medium that includes code executable by one or more processors.

Figure 10:
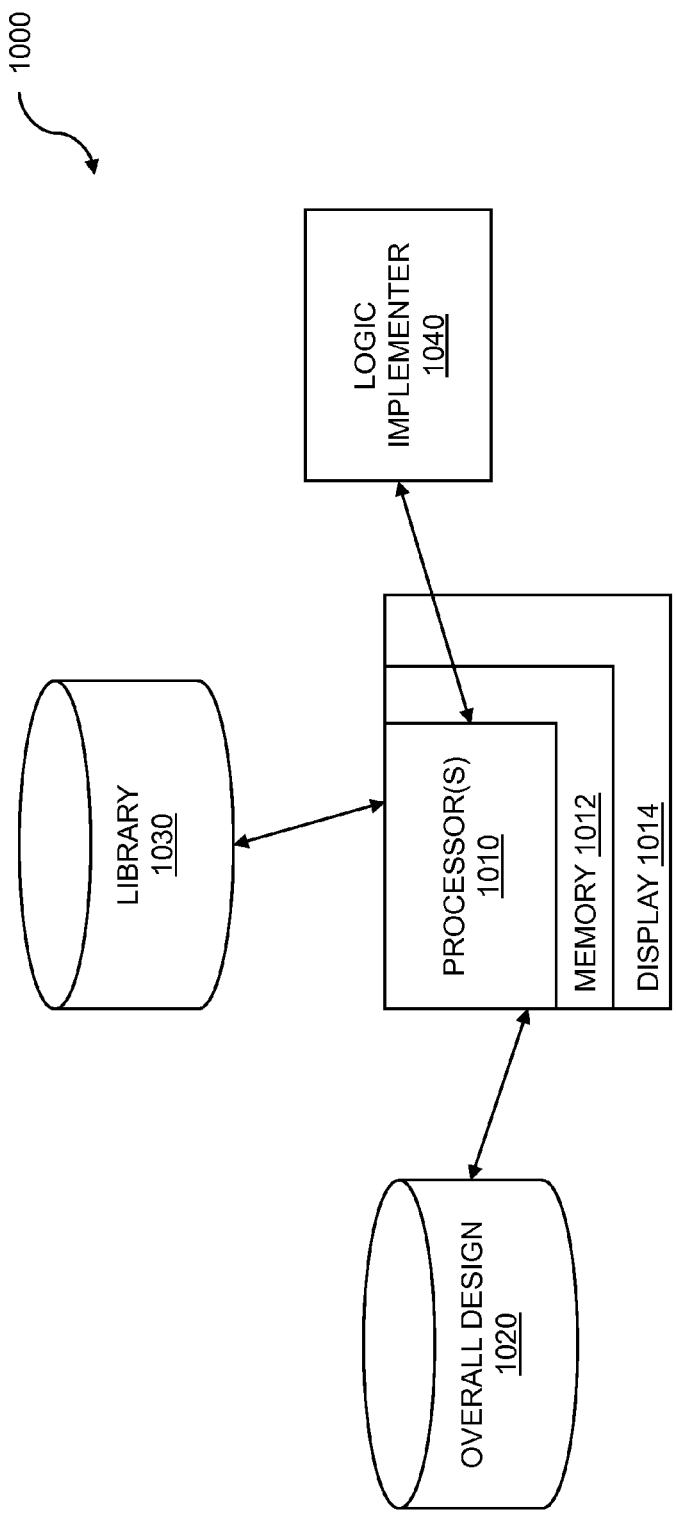
FIG. 10 is a diagram of a system for implementing a null convention logic circuit.

FIG. 10 is a diagram of a system 1000 for implementing a null convention logic circuit. The system 1000 includes one or more processors 1010 and a memory 1012 which stores instructions. The memory 1012 is coupled to the one or more processors 1010 wherein the one or more processors

1010 can execute instructions stored in the memory 1012. The memory 1012 can be used for storing instructions, for storing circuit designs, for storing logic designs, for system support, and the like. The one or more processors 1010 can read in an overall design 1020. The overall design can include a circuit design for performing one or more functions. The overall design 1020 can include files stored in a data format used by electronic design automation (EDA) tools for the development of integrated circuits. The format can include data stored in a format such as GDSII (GDS2), GL1, OASIS, or another suitable format for storing an overall design.

The one or more processors 1010 can further utilize a library 1030. The library 1030 can contain design data such as standard cells, circuits, and other frequently used logic blocks such as latches, flip-flops, logic gates, storage cells (such as SRAM cells), and the like. The library 1030 can contain data stored in a format suitable for processing by EDA tools. The one or more processors can implement various logic designs using a logic implementer 1040. The logic implementer 1040 can connect flash null convention logic gates to preceding and following logic. The logic implementer 1040 can use VHDL™, Verilog™, or another hardware description language (HDL) as an input which is used to define the desired logic. Furthermore, the logic implementer 1040 can connect the inputs and outputs of a latch circuit to the inputs of a completion circuit. The logic implementer 1040 can also implement a read-done circuit and/or an input control circuit. The logic implementer 1040 can connect the completion signal from the completion circuit to an input of the read-done circuit. The logic implementer 1040 can further connect a ready-for-next signal from the read-done circuit to the input control circuit.

Information about the various designs can be shown on a display 1014 which is attached to the one or more processors 1010. The display 1014 can be any electronic display, including but not limited to, a computer display, a laptop screen, a net-book screen, a tablet screen, a cell phone display, a mobile device display, a remote with a display, a television, a projector, or the like. In some embodiments, the system 1000 is embodied in a client computer, a server, a cloud server, or a combination thereof. In at least one embodiment, a single computer incorporates the components described above. The system 1000 can include a computer program product embodied in a non-transitory computer readable medium for logic implementation.

The system 1000 can include a computer system for logic implementation comprising: a memory which stores instructions; one or more processors coupled to the memory wherein the one or more processors are configured to: design a plurality of transistors to form a logic gate wherein: the logic gate includes a pair of inputs where the pair of inputs comprises a null convention logic true input and a null convention logic complement input; the logic gate is coupled to the pair of inputs wherein: the plurality of transistors provides for logical signal capture; the plurality of transistors includes a pair of cross-coupled inverters; the plurality of transistors includes a first pull-down device with a transistor-gate node coupled to the null convention logic true input; the plurality of transistors includes a second pull-down device with a transistor-gate node coupled to the null convention logic complement input; a "1" on the null convention logic true input causes a first side of the pair of cross-coupled inverters to go to a "0" state; and a "1" on the null convention logic complement input causes a second side of the pair of cross-coupled inverters to go to a "0" state.

Various methods can implement the logic circuits described above. Each of the methods may be executed on one or more processors on one or more computer systems. Embodiments may include various forms of distributed computing, client/server computing, and cloud based computing. Further, it will be understood that the depicted steps or boxes contained in this disclosure's flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. The elements and combinations of elements in the block diagrams and flow diagrams, show functions, steps, or groups of steps of the methods, apparatus, systems, computer program products and/or computer-implemented methods. Any and all such functions—generally referred to herein as a "circuit," "module," or "system"—may be implemented by computer program instructions, by special-purpose hardware-based computer systems, by combinations of special purpose hardware and computer instructions, by combinations of general purpose hardware and computer instructions, and so on.

A programmable apparatus which executes any of the above mentioned computer program products or computer-implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are neither limited to conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM), an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the causal entity.

While the invention has been disclosed in connection with preferred embodiments shown and described in detail, various modifications and improvements thereon will become apparent to those skilled in the art. Accordingly, the forgoing examples should not limit the spirit and scope of the present invention; rather it should be understood in the broadest sense allowable by law.

What is claimed is:

1. A logic circuit comprising:
    a pair of inputs where the pair of inputs comprise a null convention logic true input and a null convention logic complement input, wherein the null convention logic true input and the null convention logic complement input have values of "0, 0" to indicate a null condition;
    a gate, coupled to the pair of inputs, comprised of a plurality of transistors where:
        the plurality of transistors provide for logical signal capture;
        the plurality of transistors include a pair of cross-coupled inverters;
        the plurality of transistors include a first pull-down device with a transistor-gate node coupled to the null convention logic true input;
        the plurality of transistors include a second pull-down device with a transistor-gate node coupled to the null convention logic complement input;
        a "1" on the null convention logic true input causes a first side of the pair of cross-coupled inverters to go to a "0" state;
        a "1" on the null convention logic complement input causes a second side of the pair of cross-coupled inverters to go to a "0" state; and
    a completion circuit, coupled to the pair of inputs and the first side and the second side of the pair of cross-coupled inverters, wherein the completion circuit is responsive to the pair of inputs and the first side and the second side of the pair of cross-coupled inverters.

2. The circuit of claim 1 wherein the pair of cross-coupled inverters retains a value based on a last previous non-null value applied to the pair of inputs.

3. The circuit of claim 1 further comprising a first output of the gate, indicative of a logic state being stored by the pair of cross-coupled inverters.

4. The circuit of claim 3 further comprising a second output of the gate indicative of a logic state being stored by the pair of cross-coupled inverters.

5. The circuit of claim 4 wherein the first output and the second output are inverses of each other.

6. The circuit of claim 1 wherein the null convention logic true input and the null convention logic complement input have valid data values of "0, 1" and "1, 0" indicating a "0" and a "1", respectively.

7. The circuit of claim 1 wherein the null convention logic true input and the null convention logic complement input have values of "1, 1" which indicate an invalid condition.

8. The circuit of claim 1 wherein the plurality of transistors further comprises a third pull-down device in series with the first pull-down device where the transistor-gate node of the third pull-down device is coupled to an enable signal.

9. The circuit of claim 8 wherein the plurality of transistors further comprises a fourth pull-down device in series with the second pull-down device where the transistor-gate node of the fourth pull-down device is coupled to the enable signal.

10. The circuit of claim 9 wherein the enable signal allows propagation of the null convention logic true input and the null convention logic complement input to the pair of cross-coupled inverters.

11. The circuit of claim 1 wherein the plurality of transistors further comprises a third pull-down device in series with the first pull-down device where the transistor-gate node of the third pull-down device is coupled to a further null convention logic input.

12. The circuit of claim 11 wherein the first pull-down device and the third pull-down device provide for null convention logic calculation.

13. The circuit of claim 1 wherein the plurality of transistors further comprises a fourth pull-down device in series with the second pull-down device where the transistor-gate node of the fourth pull-down device is coupled to a further null convention logic input.

14. The circuit of claim 13 wherein the second pull-down device and the fourth pull-down device provide for null convention logic calculation.

15. The circuit of claim 1 further comprising a read circuit coupled to the pair of cross-coupled inverters which provides a null convention logic true output and a null convention logic complement output.

16. The circuit of claim 15 further comprising a read-done circuit, coupled to the read circuit, which indicates when a read of the pair of cross-coupled inverters is accomplished within a null convention logic environment.

17. A computer-implemented method for using a logic implementation comprising:
   obtaining a pair of inputs where the pair of inputs comprises a null convention logic true input and a null convention logic complement input, wherein the null convention logic true input and the null convention logic complement input have values of "0, 0"to indicate a null condition;
   applying the null convention logic true input to a null convention logic true input of a null convention logic gate;
   applying the null convention logic complement input to a null convention logic complement input of the null convention logic gate;
   evaluating outputs for the null convention logic gate based on the null convention logic true input and the null convention logic complement input, wherein the evaluated outputs retain a value based on a last previous non-null value applied to the pair of inputs; and
   propagating a completion signal, wherein the completion signal is based on the pair of inputs and the evaluated outputs for the null convention logic gate.

18. A computer-implemented method for logic implementation comprising:
   designing a plurality of transistors to form a logic gate wherein:
      the logic gate includes a pair of inputs where the pair of inputs comprises a null convention logic true input and a null convention logic complement input, wherein the null convention logic true input and the null convention logic complement input have values of "0, 0"to indicate a null condition;
      the logic gate is coupled to the pair of inputs wherein:
         the plurality of transistors provides for logical signal capture;
         the plurality of transistors includes a pair of cross-coupled inverters;
         the plurality of transistors includes a first pull-down device with a transistor-gate node coupled to the null convention logic true input;
         the plurality of transistors includes a second pull-down device with a transistor-gate node coupled to the null convention logic complement input;
         a "1"on the null convention logic true input causes a first side of the pair of cross-coupled inverters to go to a "0"state;
         a "1"on the null convention logic complement input causes a second side of the pair of cross-coupled inverters to go to a "0"state; and
         the plurality of transistors includes a completion circuit, coupled to the pair of inputs and the first side and the second side of the pair of cross-coupled inverters, wherein the completion circuit is responsive to the pair of inputs and the first side and the second side of the pair of cross-coupled inverters.

19. A computer system for logic implementation comprising:
   a memory which stores instructions;
   one or more processors coupled to the memory wherein the one or more processors are configured to:
      design a plurality of transistors to form a logic gate wherein:
         the logic gate includes a pair of inputs where the pair of inputs comprises a null convention logic true input and a null convention logic complement input, wherein the null convention logic true input and the null convention logic complement input have values of "0, 0"to indicate a null condition;
         the logic gate is coupled to the pair of inputs wherein:
            the plurality of transistors provides for logical signal capture;
            the plurality of transistors includes a pair of cross-coupled inverters;
            the plurality of transistors includes a first pull-down device with a transistor-gate node coupled to the null convention logic true input;
            the plurality of transistors includes a second pull-down device with a transistor-gate node coupled to the null convention logic complement input;
            a "1"on the null convention logic true input causes a first side of the pair of cross-coupled inverters to go to a "0"state;
            a "1"on the null convention logic complement input causes a second side of the pair of cross-coupled inverters to go to a "0"state; and
            the plurality of transistors includes a completion circuit, coupled to the pair of inputs and the first side and the second side of the pair of cross-coupled inverters, wherein the completion circuit is responsive to the pair of inputs and the first side and the second side of the pair of cross-coupled inverters.

20. The circuit of claim 1, wherein the completion circuit further comprises an additional pair of cross-coupled inverters having a first side and a second side.

21. The circuit of claim 20 further comprising a read circuit coupled to the pair of cross-coupled inverters which provides a null convention logic true output and a null convention logic complement output.

22. The circuit of claim 21 further comprising a read-done circuit, coupled to the read circuit, which indicates when a read of the pair of cross-coupled inverters is accomplished within a null convention logic environment, wherein the coupling to the read circuit is to the second side of the additional pair of cross-coupled inverters.

23. The circuit of claim 22 wherein the completion circuit further comprises a first, a second, a third, and a fourth NMOS transistor coupled to the first side of the additional pair of cross-coupled inverters.

24. The circuit of claim 23 wherein the completion circuit further comprises a first and a second PMOS transistor coupled to the first side of the additional pair of cross-coupled inverters.

* * * * *